United States Patent [19]

Maeda et al.

[11] 4,160,923

[45] Jul. 10, 1979

[54] TOUCH SENSITIVE ELECTRONIC SWITCHING CIRCUIT FOR ELECTRONIC WRISTWATCHES

[75] Inventors: Hidetoshi Maeda; Toshihiro Ohba, both of Tenri, Japan

[73] Assignee: Sharp Kabushiki Kaisha, Osaka, Japan

[21] Appl. No.: 863,087

[22] Filed: Dec. 22, 1977

Related U.S. Application Data

[63] Continuation of Ser. No. 655,213, Feb. 4, 1976, abandoned.

[30] Foreign Application Priority Data

Feb. 5, 1975 [JP] Japan .................................. 50-15727

[51] Int. Cl.² ...................... H03K 3/353; H02H 9/04; G04B 19/00; H03K 17/60
[52] U.S. Cl. .................................. 307/308; 58/23 A; 58/50 R; 307/200 B; 307/304; 307/360; 361/56; 361/58
[58] Field of Search ............................ 307/116–118, 307/200 B, 360, 362, 363, 304, 308; 328/1, 4, 5; 58/23 R, 23 A, 23 BA, 23 D, 50 R, 50 A; 361/56, 58

[56] References Cited

U.S. PATENT DOCUMENTS

| | | | |
|---|---|---|---|
| 3,543,056 | 11/1970 | Klein | 307/304 X |
| 3,823,550 | 7/1974 | Bergey | 58/50 R |
| 3,851,189 | 11/1974 | Moyer | 307/279 |
| 3,871,170 | 3/1975 | Bergey | 58/50 R |
| 3,913,006 | 10/1975 | Fillmore | 58/23 A X |
| 3,917,964 | 11/1975 | Carlson | 307/304 |
| 3,942,318 | 3/1976 | Fujita | 58/50 R X |
| 3,944,843 | 3/1976 | Martins | 328/5 X |
| 3,956,880 | 5/1976 | O'Connor | 58/50 R X |

*Primary Examiner*—Larry N. Anagnos
*Attorney, Agent, or Firm*—Birch, Stewart, Kolasch & Birch

[57] ABSTRACT

In a touch sensitive electronic switching circuit including a C-MOS inverter, for use in electronic wristwatches, a resistor of 1–10 MΩ is connected to the source electrode of the P-channel MOS type field effect transistor included within the C-MOS inverter, whereby the threshold voltage level of the C-MOS inverter is shifted to a low level to enhance the reliability of the touch sensitive electronic switching circuit. In another embodiment, the resistor of 1–10 MΩ is connected to the source electrode of the N-channel MOS type field effect transistor included within the C-MOS inverter, whereby the threshold voltage level of the C-MOS inverter is shifted to a high level to enhance the reliability of the touch sensitive electronic switching circuit.

4 Claims, 4 Drawing Figures

TOUCH SENSITIVE ELECTRONIC SWITCHING CIRCUIT FOR ELECTRONIC WRISTWATCHES

This application is a continuation of copending application Ser. No. 655,213, filed on Feb. 4, 1976, now abandoned.

BACKGROUND OF THE INVENTION

The present invention relates to a touch sensitive electronic switching circuit including a C-MOS inverter, for use in electronic wristwatches.

Recently, it has been proposed to provide a touch sensitive electronic switch in an electronic wristwatch because the touch sensitive electronic switch is simple in construction and operation as compared with the conventional machanical switch such as a pushbutton switch. Moreover, a switching circuit for the touch sensitive electronic switch can be incorporated in an integrated circuit constituting a time calculation circuit of the electronic wristwatch.

The switching circuit of the touch sensitive electronic switch for use in an electronic wristwatch usually includes a C-MOS inverter. Such a switching circuit is described in copending application Ser. No. 575,731 filed May 8, 1975, by Takehiko Tasaki and Hidetoshi Maeda which is assigned to the same assignee as the present invention. The threshold voltage levels of the C-MOS inverter are unavoidably different from each other due to different makes of the individual C-MOS inverters. When the resistance value caused by the operator who touches the electrodes of the touch sensitive electronic switch is considerably high, there is a possibility that the switching circuit can not change its state. Therefore, it is required, to enhance the reliability of the touch sensitive electronic switching circuit, to shift the threshold voltage level of the C-MOS inverter to a high level or to a low level.

OBJECTS AND SUMMARY OF THE INVENTION

Accordingly, an object of the present invention is to enhance the reliability of a touch sensitive electronic switching circuit including a C-MOS inverter, for use in electronic wristwatches.

Another object of the present invention is to provide a touch sensitive electronic switching circuit suitable for applying integrated circuit technique.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to an embodiment of the present invention, a resistor of high resistance is connected to the source electrode of the P-channel MOS type field effect transistor incorporated within the C-MOS inverter, whereby the threshold voltage level of the C-MOS inverter is shifted to a low level. In another embodiment, a resistor of high resistance is connected to the source electrode of the N-channel MOS type field effect transistor included within the C-MOS inverter, whereby the threshold voltage level of the C-MOS inverter is shifted to a high level. The resistance value of the resistor connected to the source electrode is below 10 MΩ and, therefore, it can be incorporated within the integrated circuit constituting the time calculation circuit of the electronic wristwatch.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
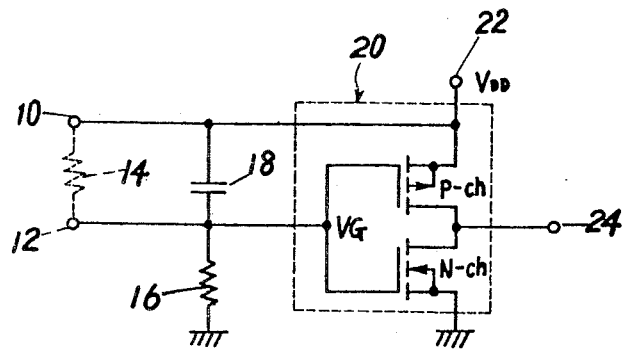
FIG. 1 is a schematic circuit diagram showing a principal construction of a touch sensitive electronic switching circuit employing a C-MOS inverter.

Referring now in detail to the drawings, and to facilitate a more complete understanding of the present invention, a principal construction of a touch sensitive electronic switching circuit employing a C-MOS inverter, for use in electronic wristwatches will be first described with reference to FIG. 1.

Input terminals 10 and 12 are connected to input electrodes, which are formed, in a preferred embodiment, on a metal rear frame of an electronic wristwatch and on a front glass window of the electronic wristwatch, respectively. One electrode formed on the metal rear frame is kept in contact with the operator's wrist when the operator wears the wristwatch, and the other electrode formed on the front glass window is made of conductive transparent film and is isolated from the metal rear frame. When the operator touches the transparent electrode formed on the front glass window by, for example, his hand opposite to the hand wearing the wristwatch, the input terminals 10 and 12 are connected with each other through a resistor 14 caused by the operator's body.

The touch sensitive electronic switching circuit mainly comprises a pull-down resistor 16, a capacitor 18, the pull-down resistor 16 and the capacitor 18 forming, in combination, a filter circuit for inhibiting the introduction of the induced noise, and a C-MOS inverter 20. The C-MOS inverter 20 includes a P-channel MOS type field effect transistor P-ch (referred to as P-chFET hereinafter) and an N-channel MOS type field effect transistor N-ch (referred to as N-chFET hereinafter. The C-MOS inverter 20 is connected to receive a power supply of a voltage level $V_{DD}$ through a terminal 22 and develops an output signal through an output terminal 24.

In the normal condition, that is, when the operator does not touch the transparent electrode formed on the front glass window, namely, when the input terminals 10 and 12 are not connected with each other, a gate input level $V_G$ of the C-MOS inverter 20 is maintained at approximately the ground potential via the pull-down resitor 16 and, therefore, the input signal of the C-MOS inverter bears the logic value "0" and hence the output signal thereof takes the logic value "1". When the operator touches the transparent electrode formed on the front glass window of the electronic wristwatch, the input terminals 10 and 12 are connected with each other through the resistor 14 caused by the operator's body and, therefore, the gate input level $V_G$ of the C-MOS inverter 20 becomes identical with the voltage level divided by the resistor 14 and the pull-down resistor 16, thereby to invert the output logic value of the C-MOS inverter 20 from the logic value "1" to the logic value "0".

The threshold voltage level $V_T$, which inverts the logic value of the gate input level $V_G$ of the C-MOS inverter 20 from "0" to "1", are unavoidably different from each other due to different makes of the individual C-MOS inverters and usually reside within a wide range between 0.3 $V_{DD}$ and 0.7 $V_{DD}$. It is required, in the circuit shown in FIG. 1, that the threshold voltage level $V_T$ is as low as possible, because the gate input level $V_G$ certainly takes the logic value "1" even when the resistor 14 of the operator's body takes a considerably high value under the condition where the threshold voltage level $V_T$ is considerably low.

Alternatively, it is proposed to select the resistance value of the pull-down resistor 16 at a high level under the circumstances when the threshold voltage level $V_T$ is considerably high, because the gate input level $V_G$ is determined by the voltage level divided by the resistor 14 and the pull-down resistor 16. However, the resistor 16 occupies a large area in the integrated circuit chip when the resistance value is considerably high and, apparently, it is not desirable for integrated circuit construction.

Figure 2:
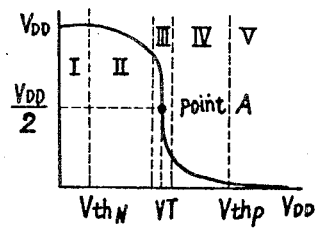
FIG. 2 is a graph showing output voltage level versus input signal level characteristics of a C-MOS inverter used in a touch sensitive electronic switching circuit of the present invention.

In general, output voltage level versus input signal level characteristics of the C-MOS inverter are classified into five (5) regions as shown in FIG. 2. In the respective regions, the P-chFET (P-ch) and the N-chFET (N-ch) constituting the C-MOS inverter show the characteristics listed as follows:

|        |       | P-chFET              | N-chFET              |
|--------|-------|----------------------|----------------------|
| Region | (I)   | Triode Characteristic| Breaking             |
|        | (II)  | Triode Characteristic| Saturation           |
|        | (III) | Saturation           | Saturation           |
|        | (IV)  | Saturation           | Triode Characteristic|
|        | (V)   | Breaking             | Triode Characteristic|

The channel resistance is around 1,000 MΩ at the breaking region and gradually decreases to show around 1 KΩ at the triode characteristic region. The channel resistance values of the P-chFET and the N-chFET become identical with each other at a point A in the third region (III).

Usually, the threshold voltage level $V_T$ is the voltage level at which the channel resistance of the p-chFET and the n-chFET show the same values. Therefore, the threshold voltage level $V_T$ of the C-MOS inverter can be shifted to a low level by connecting a high resistor to the source electrode of the P-chPET, because the threshold voltage level $V_T$ becomes a voltage level at which the channel resistance value of the N-chFET is identical with the resistance value determined by the arithmetic sum of the high resistor and the channel resistance of the P-chFET.

Figure 3:
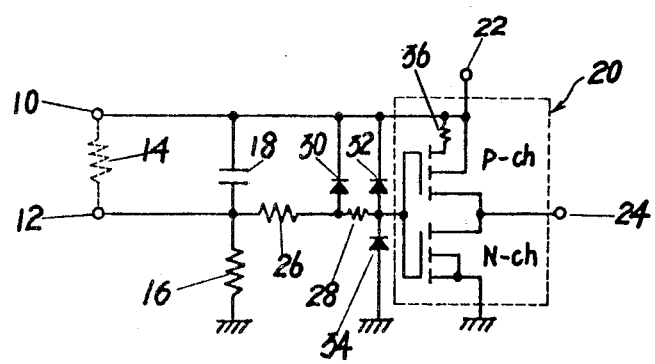
FIG. 3 is a circuit diagram showing an embodiment of a touch sensitive electronic switching circuit of the present invention.

FIG. 3 shows an embodiment of the present invention. Like elements corresponding to those of FIG. 1 are indicated by like numerals.

Resistors 26 and 28, and diodes 30, 32 and 34 form, in combination, a gate protective circuit. A resistor 36 of 1–10 MΩ is connected to the source electrode of the P-chFET (P-ch) incorporated within the C-MOS inverter 20. With such an arrangement, the threshold voltage level $V_T$ of the C-MOS inverter 20 is shifted to around the breaking region (near $V_{thN}$ in FIG. 2) of the N-chFET. It will be clear that the threshold voltage level $V_T$ of the C-MOS inverter 20 is shifted to a low level by provision of the high resistor 36, whereby the state of the C-MOS inverter 20 is certain to invert even when the resistor 14 of the operator's body is considerably high.

In the embodiment of FIG. 3, the pull-down resistor 16 is around 20 MΩ, and the resistor 36 connected to the source electrode of the P-chFET is 1–10 MΩ. When the same effect is expected by the circuit shown in FIG. 1, the pull-down resistor 16 should be above 30 MΩ.

Figure 4:
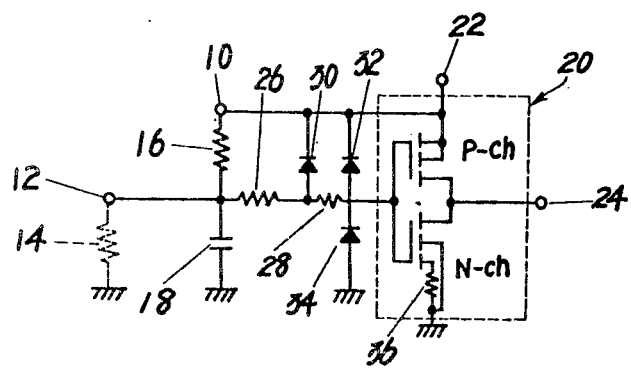
FIG. 4 is a circuit diagram showing another embodiment of a touch sensitive electronic switching circuit of the present invention.

FIG. 4 shows another embodiment of the present invention. Like elements corresponding to those of FIG. 3 are indicated by like numerals.

The pull-down resistor 16 is installed between the terminals 10 and 12. When the operator touches the transparent electrode formed on the front glass window of the electronic wristwatch, the input terminal 12 is connected to the ground potential via the resistor 14 of the operator's body. The high resistor 36 of 1–10 MΩ is connected to the source electrode of the N-chFET (M-ch) incorporated in the C-MOS inverter 20, thereby to shift the threshold voltage level $V_T$ of the C-MOS inverter 20 to a high level. With such an arrangement, the C-MOS inverter is certain to change its state even though the resistor 14 of the operator's body is considerably high.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A touch sensitive electronic switching circuit for electronic wristwatches including a C-MOS inverter having a P-channel MOS field effect transistor and an N-channel field effect transistor, the gates of the respective transistors being coupled together and the drains of said transistors being coupled together, first and second input terminals for said C-MOS inverter across which an operator's body completes an electrical circuit to initiate switching of said C-MOS inverter from one state to another, a bias voltage source of a first level coupled to the source electrode of said P-channel transistor, a bias voltage source of a second level coupled to the source electrode of said N-channel transistor, said first level being higher than said second level, a pull-down resistor connecting said second input terminal with said bias voltage source of said second level, means connecting said first input terminal to said bias voltage source of said first level, and means connecting said second input terminal to a common gate terminal of the P and N channels of the C-MOS inverter, the improvement comprising:

resistor means of a high resistive value connected between said bias voltage source of said first level and the source electrode of said P-channel transistor, the ratio of the resistance of said resistor means to the resistance of said pull-down resistor being within a predetermined range.

2. The touch sensitive electronic switching circuit of claim 1 wherein the resistance of said resistor means is in the range of 1–10 MΩ and the resistance of said pull-down resistor is approximately 20 MΩ.

3. The touch sensitive electronic switching circuit of claim 1, wherein the touch sensitive electronic switching circuit is incorporated within an integrated circuit constituting a time calculation circuit of the electronic wristwatch.

4. A touch sensitive electronic switching circuit for electronic wristwatches including a C-MOS inverter having a P-channel MOS field effect transistor and an N-channel field effect transistor, the gates of said respective transistors being coupled together and the drains of said transistors being coupled together, first and second input terminals for said C-MOS inverter across which an operator's body completes an electrical circuit to initiate switching of said C-MOS inverter from one state to another, a bias voltage source of a first level coupled to the source electrode of said P-channel transistor, a bias voltage source of a second level coupled to the source electrode of said N-channel transistor, said first level being higher than said second level, a pull-down resistor connecting said first input terminal with said bias voltage source of said first level, means connecting said second input terminal to said bias voltage source of said second level, and means connecting said first input terminal to a common gate terminal of the P and N channels of the C-MOS inverter, the improvement comprising:

resistor means of a high resistive value connected between said bias voltage source of said second level and the source electrode of said N-channel transistor, the ratio of the resistance of said resistor means to the resistance of said pull-down resistor being within a predetermined range.

5. The touch sensitive switching circuit of claim 4 wherein the resistance of said resistor means is in the range of 1–10 MΩ and the resistance of said pull-down resistor is approximately 20 MΩ.

6. The touch sensitive electronic switching circuit of claim 4, wherein the touch sensitive electronic switching circuit is incorporated within an integrated circuit constituting a time calculation circuit of the electronic wristwatch.

* * * * *